(12) United States Patent
Gahoi et al.

(10) Patent No.: US 9,152,520 B2
(45) Date of Patent: Oct. 6, 2015

(54) PROGRAMMABLE INTERFACE-BASED VALIDATION AND DEBUG

(71) Applicant: Texas Instruments, Incorporated, Dallas, TX (US)

(72) Inventors: Anshul Gahoi, Bangalore (IN); Raghavendra Santhanagopal, Bangalore (IN); Pradeep Kumar Babu, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/038,743

(22) Filed: Sep. 26, 2013

(65) Prior Publication Data

US 2015/0089289 A1    Mar. 26, 2015

(51) Int. Cl.
| | |
|---|---|
| G06F 17/50 | (2006.01) |
| G06F 9/44 | (2006.01) |
| G01R 31/28 | (2006.01) |
| G01R 27/28 | (2006.01) |
| G06F 11/27 | (2006.01) |
| G01R 13/28 | (2006.01) |

(52) U.S. Cl.
CPC .............. G06F 11/27 (2013.01); *G01R 13/28* (2013.01); *G06F 9/44* (2013.01); *G06F 17/5027* (2013.01); *G06F 17/5054* (2013.01)

(58) Field of Classification Search
CPC ... G06F 17/5054; G06F 17/5027; G06F 9/44; G06F 11/27; G01R 31/28; G01R 27/28
USPC ............ 716/136, 106, 117, 121, 128; 714/30, 714/33, 733; 324/527, 750.15, 750.3; 702/118, 58
See application file for complete search history.

(56) References Cited

U.S. PATENT DOCUMENTS

| | | | | |
|---|---|---|---|---|
| 5,243,274 | A * | 9/1993 | Kelsey et al. | 714/724 |
| 5,425,036 | A | 6/1995 | Liu et al. | |
| 5,475,624 | A | 12/1995 | West | |
| 5,751,737 | A * | 5/1998 | Lagrotta et al. | 714/727 |
| 6,034,542 | A * | 3/2000 | Ridgeway | 326/39 |
| 6,462,570 | B1 * | 10/2002 | Price et al. | 324/756.02 |
| 6,668,237 | B1 * | 12/2003 | Guccione et al. | 702/119 |
| 6,801,869 | B2 * | 10/2004 | McCord | 702/117 |

(Continued)

OTHER PUBLICATIONS

NB8908477, "PRODD—a Device Test Driver for the DFCI Interface", IBM Technical Disclosure Bulletin, vol. 32, No. 3B, Aug. 1, 1989, pp. 477-485 (5 pages).*

(Continued)

*Primary Examiner* — Phallaka Kik
(74) *Attorney, Agent, or Firm* — Robert D. Marshall, Jr.; Frank D. Cimino (57) ABSTRACT

A programmable interface-based validation and debug system includes, for example, a test connector that is arranged to communicatively couple a design under test to the test fixture. A programmable logic interface is communicatively coupled to the test connector and is arranged to receive a downloadable test bench, where the downloadable test bench is arranged to apply test vectors from a first set of test vectors to a first test control bus. A multiplexer is arranged to selectively couple one of the first test control bus and a second test control bus to a shared test bus that is coupled to the test connector, where the second test control bus is arranged to apply test vectors from a second set of test vectors provided by, for example, a debugger that is operated by a human.

12 Claims, 4 Drawing Sheets

(56) References Cited

U.S. PATENT DOCUMENTS

| | | | |
|---|---|---|---|
| 7,188,063 B1 | 3/2007 | Snyder | |
| 7,219,287 B1* | 5/2007 | Toutounchi et al. | 714/738 |
| 7,454,729 B1* | 11/2008 | Kanji et al. | 716/113 |
| 7,496,820 B1* | 2/2009 | Theron et al. | 714/738 |
| 7,906,982 B1* | 3/2011 | Meade et al. | 324/756.03 |
| 8,127,187 B2* | 2/2012 | Xia et al. | 714/726 |
| 8,620,638 B1* | 12/2013 | Chan et al. | 703/14 |
| 8,949,759 B2* | 2/2015 | Manohar et al. | 716/117 |
| 2003/0074153 A1* | 4/2003 | Sugamori et al. | 702/122 |
| 2004/0093488 A1* | 5/2004 | Horanzy | 713/1 |
| 2004/0111252 A1* | 6/2004 | Burgun et al. | 703/28 |
| 2004/0254779 A1* | 12/2004 | Wang et al. | 703/27 |
| 2005/0237073 A1* | 10/2005 | Miller et al. | 324/754 |
| 2007/0234247 A1* | 10/2007 | Pritchard et al. | 716/4 |
| 2007/0261009 A1* | 11/2007 | Granicher et al. | 716/1 |
| 2008/0100320 A1* | 5/2008 | Miller et al. | 324/754 |
| 2009/0160483 A1* | 6/2009 | Verma et al. | 326/41 |
| 2009/0287969 A1* | 11/2009 | White et al. | 714/704 |
| 2010/0161306 A1* | 6/2010 | Burgun et al. | 703/20 |
| 2010/0312517 A1* | 12/2010 | McNamara et al. | 702/119 |
| 2011/0055780 A1* | 3/2011 | Venell | 716/106 |
| 2011/0078525 A1* | 3/2011 | Xia et al. | 714/731 |
| 2011/0239047 A1* | 9/2011 | Suwa | 714/32 |
| 2013/0227367 A1* | 8/2013 | Czamara et al. | 714/735 |
| 2014/0139251 A1* | 5/2014 | De La Puente et al. | 324/756.03 |
| 2014/0207402 A1* | 7/2014 | Ferry | 702/119 |
| 2014/0236526 A1* | 8/2014 | Frediani et al. | 702/119 |
| 2014/0236527 A1* | 8/2014 | Chan et al. | 702/119 |
| 2014/0237292 A1* | 8/2014 | Chan | 714/32 |
| 2014/0282327 A1* | 9/2014 | Mehta et al. | 716/112 |

OTHER PUBLICATIONS

Coppola et al., "PLD, complex PLD, and FPGA applications using VHDL", IEEE, Northcon/93, Conference Record, Oct. 12-14, 1993, pp. 93-101.*

Fawcett, "Map, place and route: the key to high-density PLD implementation", IEEE, WESCON/'97 Conference Record, Nov. 7-9, 1995, pp. 292-297.*

Heath et al., "Routing algorithms for programmable logic device design and manufacturing test development", IEEE, Proceedings of 2001 IEEE Systems and Readiness Technology Conference, Aug. 20-23, 2001, pp. 214-228.*

Knack, "Panel: Design Automation Tools for FGPA Design", IEEE, 31$^{st}$ Conference on Design Automation, Jun. 6-10, 1994, p. 676.*

International Search Report and Written Opinion for PCT/US2014/057579, mailed Jan. 15, 2015.

* cited by examiner

FIG. 4

PROGRAMMABLE INTERFACE-BASED VALIDATION AND DEBUG

BACKGROUND

Automatic Test Equipment (ATE) is used for validation and debugging of many electronic designs, and especially the electronic designs implemented using integrated circuits. Because of the relative complexity of the integrated circuits, debugging and device validation is typically time consuming and involves much iteration of test vectors using the ATE. Because of the complexity of the ATE, the cost for using the ATE for debugging of the designs-under-test is commensurately expensive. The difficulty of debugging is further compounded by input/output limitations of the interface used to exercise the design-under-test.

SUMMARY

The problems noted above can be solved in large part by a programmable interface-based validation and debug system that, for example, provides a cost-effective solution for enhancing ad-hoc network communications. A programmable interface-based validation and debug system includes, for example, a test connector that is arranged to communicatively couple a design under test to the test fixture. A programmable logic interface is communicatively coupled to the test connector and is arranged to receive a downloadable test bench, where the downloadable test bench is arranged to apply test vectors from a first set of test vectors to a first test control bus. A multiplexer is arranged to selectively couple one of the first test control bus and a second test control bus to a shared test bus that is coupled to the test connector, where the second test control bus is arranged to apply test vectors from a second set of test vectors provided by, for example, a debugger that is operated by a human.

This Summary is submitted with the understanding that it is not be used to interpret or limit the scope or meaning of the claims. Further, the Summary is not intended to identify key features or essential features of the claimed subject matter, nor is it intended to be used as an aid in determining the scope of the claimed subject matter.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be example of that embodiment, and not intended to intimate that the scope of the disclosure, including the claims, is limited to that embodiment.

Certain terms are used throughout the following description—and claims—to refer to particular system components. As one skilled in the art will appreciate, various names may be used to refer to a component or system. Accordingly, distinctions are not necessarily made herein between components that differ in name but not function. Further, a system can be a sub-system of yet another system. In the following discussion and in the claims, the terms "including" and "comprising" are used in an open-ended fashion, and thus are to be interpreted to mean "including, but not limited to . . . . " Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections. The term "portion" can mean an entire portion or a portion that is less than the entire portion. The term "test vectors" can mean information used to set or validate the setting of test pins even when the test pins appear in a single line of code.

Figure 1:
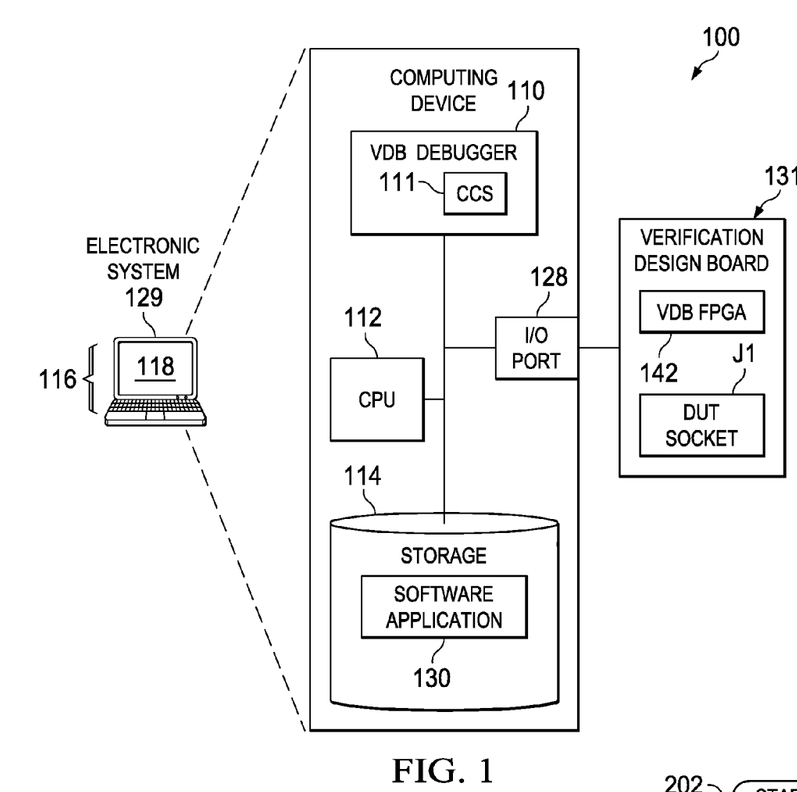
FIG. 1 shows an illustrative electronic device in accordance with example embodiments of the disclosure.

FIG. 1 shows an illustrative computing device 100 in accordance with preferred embodiments of the disclosure. For example, the computing device 100 is, or is incorporated into, an electronic system 129, such as a laptop, a mobile device, a personal digital assistant, a personal computer, electronics control "box" or display, electronic test bench, or any other type of electronic system. The computing device 100 can be powered from line current, solar cells, and/or battery (or capacitive) storage.

In some embodiments, the computing device 100 comprises a megacell or a system-on-chip (SoC) which includes control logic such as a CPU 112 (Central Processing Unit), a storage 114 (e.g., random access memory (RAM)) and a VDB debugger 110 (e.g., executable software at least partially embodied in hardware) program that it is arranged to access the VDB (validation design and debug board) 131. The CPU 112 can be, for example, a CISC-type (Complex Instruction Set Computer) CPU, RISC-type CPU (Reduced Instruction Set Computer), MCU-type (Microcontroller Unit), or a digital signal processor (DSP). The storage 114 (which can be memory such as on-processor cache, off-processor cache, RAM, flash memory, or disk storage) stores one or more software applications 130 (e.g., embedded applications) that, when executed by the CPU 112, perform any suitable function associated with the computing device 100.

The CPU 112 comprises memory and logic that store information frequently accessed from memory provided by the storage 114. The computing device 100 is often controlled by a user using a UI (user interface) 116, which provides output to and receives input from the user during the execution the software application 130. The output is provided using the display 118, indicator lights, a speaker, vibrations, and the like. The input is received using audio and/or video inputs (using, for example, voice or image recognition), and mechanical devices such as keypads, switches, proximity detectors, and the like. The CPU 112 and VDB debugger 110 is coupled to I/O (Input-Output) port 128, which provides an interface such as a JTAG (joint test action group) interface that is configured to receive input from (and/or provide output to) the VDB board 131. The I/O port 128 can be a bus such as a USB (universal serial bus), RS- (Radio-Sector of the Electronic Industries Alliance-) 232, I2C (inter-integrated circuit), and the like. The computing device 100 can also be coupled to peripherals and/or computing devices, including tangible, non-transitory media (such as flash memory) and/or cabled or wireless media. These and other input and output devices are selectively coupled to the computing device 100 by external devices using wireless or cabled connections. The storage 114 can be accessed by, for example, external devices via I/O port 128.

The VDB debugger 110 is a monitoring and control system and comprises logic and functionality (embodied at least partially in hardware and at least partially controlled by software application 130, which is at least partially stored in storage 114) that supports monitoring, controlling, testing, and debugging of a design-under-test (DUT). For example, the VDB debugger 110 can be used to download and/or control programmable logic (embodied at least partially in hardware) interface such as VDB FPGA (field-programmable gate array) 142 included in a test fixture such as validation design and debug board (VDB) 131. Thus, the debugger 110 is (for example) a self-contained computer system (such as a laptop personal computer) that is different from the test fixture such as the VDB board 131.

The components of the VDB debugger 110 and VDB FPGA 142 allow validation of a physical DUT and/or an emulator of the DUT via connector J1. For example, an emulator can be used to replicate the operation of the DUT (e.g., by plugging in an emulator socket into the connector J1), were it actually functioning in an intended final embodiment (such as a packaged integrated circuit), would perform in various situations (e.g., how the components of the DUT would interact with the software application 130). In this way, the DUT can be debugged in a single environment which resembles pre- or post-production operation.

Conventional test equipment typically provides a predominantly hardware-oriented environment that interacts with designs-under-test in a relatively fixed manner. For example, test vectors are loaded into a DUT memory. After program code is loaded into the device memory through the test vectors, there is typically no external control on the execution of the same. After execution of the test vectors, test results are often limited to a signature that provides an indication of whether the test passed or failed.

In contrast, The VDB debugger 110 provides control over and visibility into DUT internal circuits. For example, the VDB debugger 110 includes debugger software such as code composer studio (CCS) 111 that is used, for example, for debugging a processor (such as a microprocessor, DSP, microcontroller, and the like) integrated within the DUT. The CCS 111 provides debugging commands that are typically high-level commands that are converted into JTAG commands used for debugging the DUT. When used as a test master (as discussed further below), the CCS 111 provides visibility (e.g., of the status of DUT internal registers and memory and the like) and debugging functionality (e.g., step, run, halt, breakpoint, and the like) that surpasses, for example, validation low-level commands asserted using a JTAG (joint test action group) interface. Thus, a processor in a DUT can be halted and single stepped through the code while examining the state of internal registers as an aid to determine the causes and locations of failures that occur using the validation low-level commands.

Accordingly, the VDB FPGA 142 can be used for initial device testing, device confidence building (e.g., by executing design validation and application test after the design is reduced to silicon), as a customer demonstration board, field failure testing and the like. Additionally, the VDB FPGA 142 can be reprogrammed to adjust to (and/or provide) new interface requirements for revised or new designs-under-test, which promotes reusability and shortens design times for test equipment and fixtures.

Figure 2:
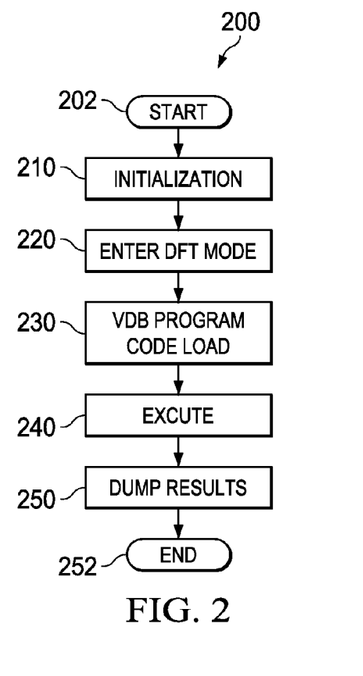
FIG. 2 is a flow diagram illustrating a test flow for performing debugging using a validation design and debug board in accordance with example embodiments of the disclosure.

FIG. 2 is a flow diagram illustrating a test flow for performing debugging using a validation design and debug board in accordance with example embodiments of the disclosure. Generally described, test flow 200 includes an example process for loading test vectors onto a design under test via a programmable interface such as VDB FPGA 142. Although the test flow is described as being related to a DUT that is embodied in (e.g., "reduced to") silicon as a monolithic integrated circuit, the disclosure is applicable to emulators of the DUT that can be coupled to the VDB FPGA 142 (e.g., via connector J1).

More particularly, the test flow begins at node 202 and proceeds to operation 210, where the validation design and debug board 131 is initialized for testing. The validation design and debug board is initialized, for example, by using a netlist to program the VDB FPGA 142 to couple test vectors (e.g., received from VDB debugger 110) to specific inputs of the DUT. The specific inputs are assigned to specific pins (e.g., an ordered "pin-out") in accordance with pins in a package (such as the pins in package of an integrated circuit) and/or connector (such as connector J1).

After programming of the VDB FPGA 142, signals on the VDB board 131 are placed in correct operating states. For example, the reset signal can be de-asserted, clocks of selected operating frequencies can be coupled to respective inputs of the DUT, and the status of electronic fuses in the DUT can be ascertained. After initialization, test flow continues in operation 220.

In operation 220, a design for test (DFT) mode is initiated. In contrast to conventional art (where, for example, JTAG-based tests are initiated and control and supervision of the process is suspended until completion of the tests), the validation design and debug board is arranged to enter a DFT mode while allowing a supervisory process (such as controlled and viewed by CCS 111) to monitor and change values of individual registers and memory locations of the DUT, run specific ranges of test vectors (e.g., single-stepping and/or selected blocks of test vectors), and halt test execution (e.g., at predetermined locations). After the design for test mode is entered, test flow 200 continues in operation 230.

In operation 230, program code for testing a DUT is loaded into the validation design and debugs board 131. More particularly, specific program code for testing a particular portion of the DUT is loaded and the various portions of the DUT can be tested loading different program code that is specific to any selected portion of the DUT that is to be tested. Thus, for example, program code for configuring a test scenario for the DUT (as well as other such program code) can be loaded onto the validation design and debug board 131 so that the program code portions is resident on the validation design and debug board 131. The program code can be loaded into one of the memories as described below with respect to FIG. 3 and following.

Each of the operations in test flow 200 can be interrupted by a supervisory process in test flow 200 such that a different operation (such as operation 230 or operation 240) can be interrupted and the status of various components can be examined by the supervisory process. Thus, for example, results of a test being executed can be examined before the test being performed is halted or otherwise terminated. Test flow 200 continues in operation 240.

In operation 240, the program code is executed. For example, a command (such as a debugging command) is received from the supervisor process (e.g., CCS 111), which directs the validation design and debug board 131 to apply (in response to the received command) selected test vectors to respective pins of the DUT. In an example where the test vectors are TDL- (test-design-language-) based, mastering of a shared JTAG bus is awarded to the supervisor process and a test sequence from the supervisor process is applied to JTAG-specific pins of the DUT in accordance with the received command.

For example, a test can be written in TDL where the test can be represented as a matrix having rows and columns. Each row of the TDL is associated with a particular time period (e.g., time slice or test clock) and where the stimulus of each row is sequentially applied to (and the response measured from) design pins of the DUT at a particular time of the test. Typically each column is associated with a design pin where each row of TDL has values that are applied as stimulus and/or values that are compared against responses received on a design pin. Thus values can be applied and/or measured at a point in the test flow that is associated with the particular row of TDL.

In various embodiments, the operations of the test flow 200 are not necessarily performed sequentially. For example, a first portion of the DUT can be tested by executing the code for testing the first portion, while a second a second portion of the DUT can be tested by executing the code for testing the second portion, where the code for testing the first portion is executed during a first time period that at least partially overlaps a second time period in which code for testing the second portion is executed. Accordingly responses to asynchronous events can be tested by varying the relative time at the code for testing the first and second portions are initiated (e.g., in response to separate commands received from CCS 111).

In operation 250, the test results are accessed (e.g., "dumped") for analysis. The test results can be accessed by monitoring I/O traces, comparing test signatures, reading on-DUT JTAG registers, reading memory and/or register contents, reading results of built-in-test (BIT) devices stored in memory, and the like.

Figure 3:
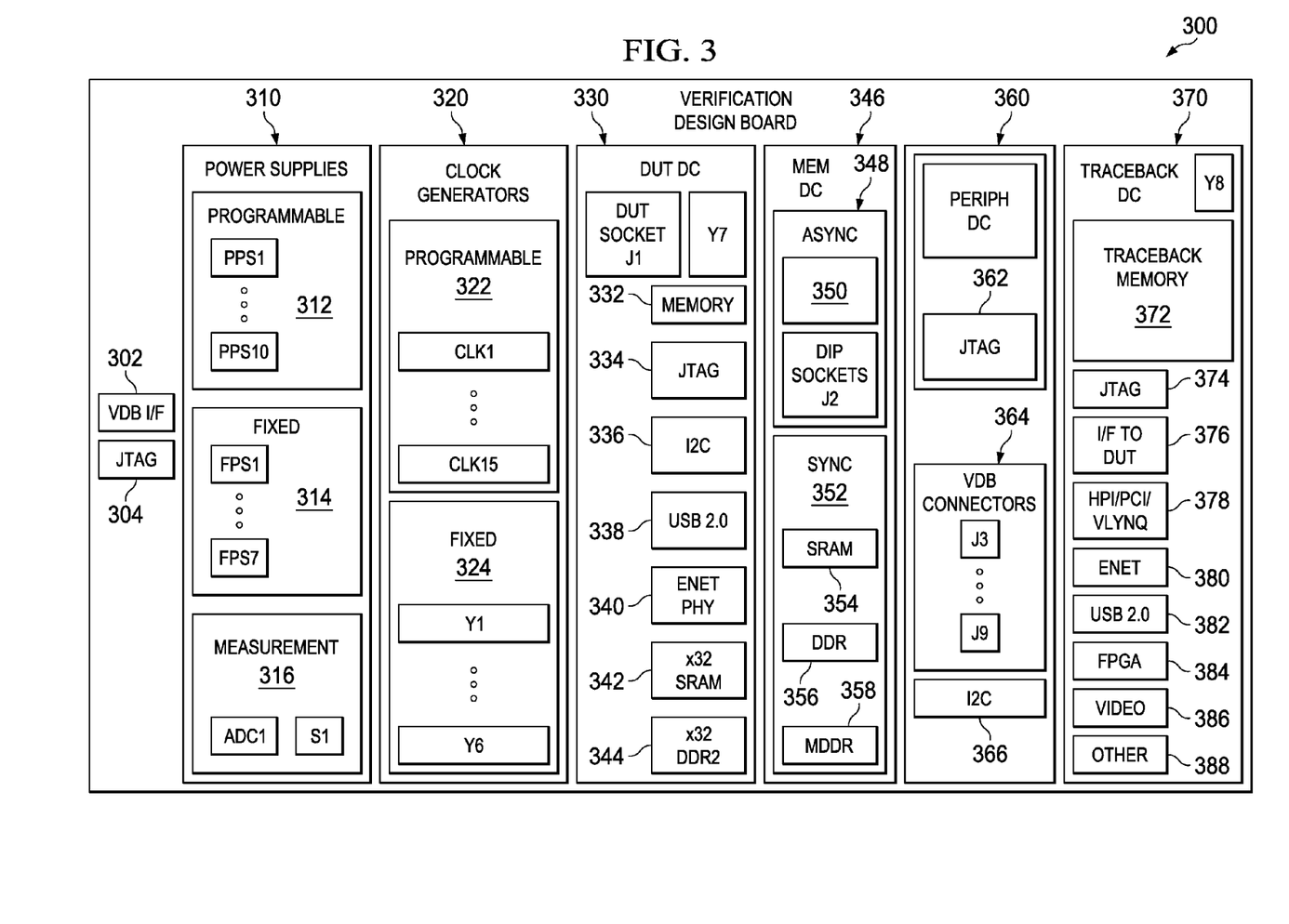
FIG. 3 is a block diagram that illustrates components of a validation design and debug board in accordance with example embodiments of the disclosure.

FIG. 3 is a block diagram that illustrates components of a validation design and debug board in accordance with example embodiments of the disclosure. Validation design and debug board 300 is a validation design and debug board such as VDB board 131 that includes one or more interfaces for communicating with a VDB controller such as VDB debugger 110. For example, a VDB debugger 110 is arranged to communicate with VDB board 300 via proprietary interface (I/F) (e.g., VDB I/F 302) or via a standards-based interface (e.g., JTAG interface 304).

Validation design and debug board 300 includes one or more power supplies for powering the VDB board 300 and a DUT coupled to the VDB board 300 via connector J1. For example, VDB 300 includes power supplies 310 such as programmable 312 power supplies PPS1-PPS10 and fixed 314 power supplies FPS1-FPS7. Programmable power supplies PPS1-PPS10 can be programmed by the VDB debugger 110 to provide voltages for programming VDB FGPA 336 and powering selected portions of a DUT. Fixed power supplies FPS1-FPS7 are arranged to provide voltages typically present in semiconductor designs such as 0.9V, 1V, 1.2V, 1.8V, 2.5V, 3.3V, and 5V, respectively. Power supply output (as well as analog signal output from the DUT) can be measured using measurement unit 316. Measurement unit 316 includes an electronic switch matrix S1 that is arranged to selectively couple (e.g., in response to a command from the VDB debugger 111) signals from the (fixed or programmable) power supplies or DUT pins (e.g., via connector J1) to an input of the analog-to-digital converter (ADC1).

Validation design and debug board 300 also includes one or more clock generators 320 for powering the VDB board 300 and a DUT coupled to the VDB board 300 via connector J1. For example, VDB board 300 includes clock generators 320 such as programmable 322 clock generators CLK1-CLK15 and fixed 324 clock generators Y1-Y7. Programmable clock generators CLK1-CLK15 can be programmed by the VDB debugger 110 to provide selected frequencies (and/or phases) for clocking selected portions of a DUT.

Validation design and debug board 300 also includes one or more daughter cards (DC) such as DUT DC 330, memory (MEM) DC 346, peripheral (PERIPH) DC 360, and a trace-back DC 370. The VDB board 300 is arranged to receive the daughter cards using connectors each of which is arranged to provide power and signals to a daughter card and receive signals from the daughter card. The functionality of each daughter card can be (e.g., instead, or portions shared between) implemented directly on the VDB board 300. However, the use of daughter cards facilitates upgrading of the VDB board 300 capabilities because, for example, an entire daughter card can be replaced as new generations of components (such as memory) for the daughter card being replaced become available.

The design-under-test daughter card (DUT DC) 330 includes functionality for hosting (and/or hosting an emulator socket for) the DUT. For example, DUT DC 330 includes a DUT connector J1 that is arranged to receive an integrated circuit containing a DUT or an emulation socket (and/or plug). The connector J1 is also arranged to couple (e.g., electrical) signals from the DUT to circuitry of the DUT DC 330. Thus, the VDB debugger 110 is arranged to communicate with the DUT via the VDB board 131 and DUT DC 330. The DUT DC 330 also includes direct communication interfaces such as JTAG interface 334, USB version 2.0 interface 338, and Ethernet (physical layer) interface 340. The direct communication interfaces allow direct communications with a variety of external peripheral devices for testing and evaluation of the DUT.

The DUT DC also includes the VDB FPGA 336. The VDB debugger 110 is arranged to program a synthesized "hardware test bench" that is arranged to apply selected test vectors to be used for testing the DUT. The synthesized hardware test bench program is ported to (e.g., used for programming) the VDB FPGA 336. The VDB FPGA 336 is programmed in accordance with the "pin-out" (including the functionality and ordering of the input/output signals) of the DUT. Thus, the VDB FPGA 336 is arranged to (e.g., sequentially) apply the selected test vectors onto corresponding pins of the DUT ("design pins") when testing the DUT (which can be a manufactured monolithic semiconductor, and emulation device that is emulating a design, an electronic system having an interface suitable for coupling to the connector J1, and the like).

Once the selected test vectors are loaded into the DUT memory (e.g., using a drive/strobe-pins bus 456 and/or JTAG bus 458 FIG. 4) via the VDB FPGA 336, the control of the executing the selected test vectors is directed to a supervisory process such as the VDB debugger 110 coupled to the VDB board 300. The VDB debugger 110 has, for example, a complete processor view of various registers or memory contents in the device under test. The VDB debugger 110 is capable of halting the execution, single stepping through the program code, adding breakpoints, and the like, which helps to shorten and quicken debug cycles. Accordingly the downloading of the synthesizable hardware test bench to the VDB FPGA 336 provides expanded visibility and controllability over conventional ATE solutions.

Validation design and debug board 300 provides memory for use by the components of the DUT DC 330 for testing the DUT. For example, DUT DC 330 includes memory 332 that is closely coupled to the DUT connector J1 and can be accessed quickly with respect to reading from or writing to the DUT. Ancillary memory such as 32-bit wide static RAM (SRAM 342) and double-data rate RAM version 2 (DDR2) 344 provide large banks of memory that are selectively coupled to the DUT using wide data busses. The ancillary memory can be used to store, supply, and capture test stimulus and/or test results such as video or audio streams. One or more clock generators Y7 are provided for generating clock signals used to control operation of components of the DUT DC 330 such and to provide selected frequencies (and/or phases) for testing selected portions of a DUT.

Validation design and debug board 300 also includes one or more expanded memory cards (MEM DC) 360 for providing and/or coupling additional memory to the VDB board 300. For example, VDB board 300 includes asynchronous memory 348 and synchronous memory 352. Asynchronous memory includes asynchronous memory components 350, which can include memory such as flash memory and/or static RAM (SRAM). Synchronous memory includes synchronous memory components 352, which can include memory such as SRAM 354, DDR 356, and mobile DDR (MDDR) 358. Dual in-line package (DIP) sockets J2 can be used to expand or replace existing memory components such as asynchronous memory components 350 and synchronous memory components 352.

Validation design and debug board 300 also includes one or more peripheral daughter cards (PERIPH DC) 360 for providing and/or coupling additional functionality to the VDB board 300. For example, VDB board 300 includes a test interface such as JTAG interface (JTAG) 362 that provides a JTAG interface for coupling test vectors from external JTAG-enabled devices. The hardware test bench downloaded into the VDB FPGA 336 can be arranged to execute JTAG-related programming in test flows initiated by external JTAG-enabled devices. The VDB debugger 110 (e.g., hosted on PC 410 FIG. 4) is arranged to control test flow programming initiated by external JTAG-enabled devices. Peripheral daughter cards (PERIPH DC) 360 provides other test interfaces for in-circuit emulation external peripherals such as Quickturn and Palladium test equipment using connectors such as J3-J9. An I2C (inter-integrated circuit) interface 366 can be used to couple (e.g., surface mounted) integrated circuits to the VDB FPGA 336, connector J1, VDB debugger 110, and other testers.

Validation design and debug board 300 also includes one or more traceback daughter cards (traceback DC) 370 for traceback functionality and/or interfacing to the VDB board 300. For example, traceback DC 370 includes traceback memory 372, which is arranged to capture information used to record the environment that exists before a trigger and/or capture event occurs. The traceback memory can be arranged as a circular queue and to continuously record (e.g., relatively) large amounts of information where older information is overwritten such that the size of the circular queue determines how much traceback information is captured. When an event occurs (such as a command received in response to a JTAG controller (such as VDB debugger 110), the recording of the data (with the exception of a selected portion of after-event recording) is stopped so that the data surrounding the event is not overwritten. The captured data that surrounds the event can be used to debug the environment (e.g., device state) that surrounds the event.

The FPGA 384 can be programmed to implement control of the traceback functionality. Oscillator Y7 is arranged to provide, for example, clocks used to drive the traceback control circuitry and provided signals for writing to and reading from the traceback memory 372. An interface to the DUT (I/F to DUT) 370 is arranged to operate in response to the FPGA 384 and, for example, to couple information from the DUT to the traceback memory 372.

The traceback DC 370 includes various interfaces used to provide traceback functionality The DUT DC 370 includes (e.g., serial) communication interfaces such as JTAG interface 374, USB version 2.0 interface 382, and Ethernet (physical layer) interface 380. The DUT DC 370 includes (e.g., serial and/or parallel) communication interfaces such as Hewlett-Packard interface (HPI), personal computer interface (PCI), and VLYNQ (Texas Instruments® proprietary interface) interface 378. The direct communication interfaces extend internal busses, for example, to busses of external peripheral devices used for testing and evaluation of the DUT. The video interface 386 and "other" interface 388 can be used to receive stimulus and/or test results such as video or audio streams.

Figure 4:
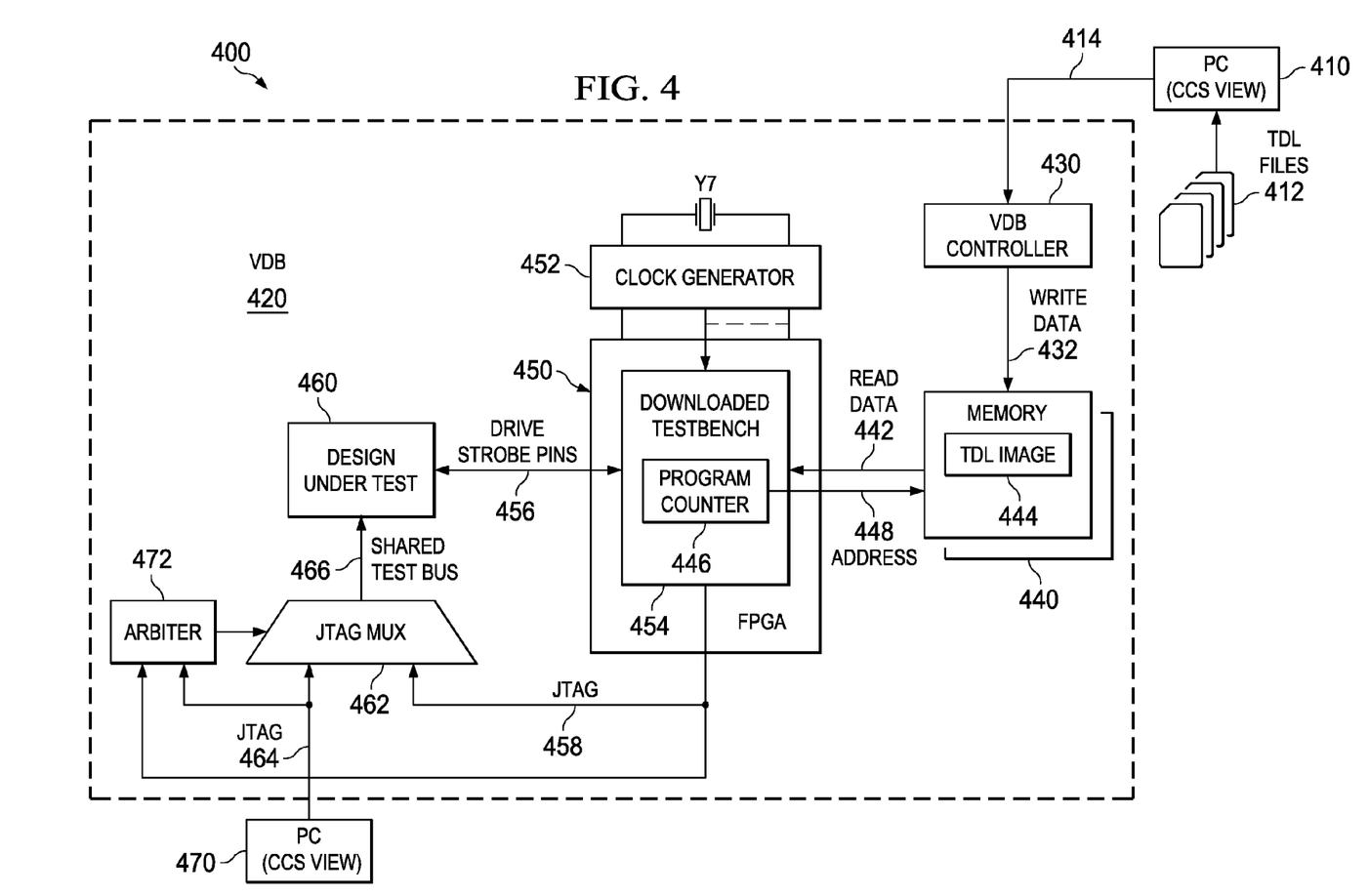
FIG. 4 is an architectural diagram that illustrates components of a validation design and debug board system in accordance with example embodiments of the disclosure.

FIG. 4 is an architectural diagram that illustrates components of a validation design and debug board system in accordance with example embodiments of the disclosure. Validation design and debug board system 400 includes a personal computer (PC) 410 and TDL files 412 that are arranged for testing a DUT 460. The PC 410 is a (e.g., personal) computing device such as computing device 100 that is arranged to create a downloadable test bench for applying selected contents of the TDL files 412 to design pins of the DUT 460. The PC 410 is arranged to download the test bench and associated test vectors to the validation design and debug board 420 (which is a validation design and debug board such as VDB board 300) using an interface such as JTAG bus 414.

VDB controller 430 is arranged to receive (via JTAG bus 414) an image of the downloadable test bench and associated test vectors. The received image of the downloadable test bench and associated test vectors stored in the selected TDL files are stored (via write bus 432) as contents of memory 440 (e.g., including TDL image 444). The contents of memory 440 are arranged to be read by the FPGA 450 via read bus 442. The FPGA 450 (under the control of VDB controller 430, for example) is arranged to read and instantiate the received image of the downloadable test bench as downloaded test bench 454. When the downloadable test bench is instantiated (e.g., programmed) as downloaded test bench 454, oscillator Y7 and clock generator 452 are arranged to provide one or more clocks for driving and clocking the downloaded test bench 454.

The downloaded test bench 454 instantiated in FPGA 450 is arranged to communicate with the design under test (DUT) 460 via drive/strobe-pins bus 456 and JTAG bus 458. Drive/strobe-pins bus 456 is typically not shared with another bus master. JTAG bus 458 is coupled to a first input of JTAG multiplexer (MUX) 462. When the downloaded test bench 454 is in a test master mode (e.g., with respect to the DUT 460), the JTAG multiplexer 462 is arranged to couple the JTAG bus 458 to the JTAG-bus design pins of the DUT 460 via shared test bus 466. Shared test bus 466 is a test controller bus (e.g., in contrast to the drive/strobe-pins bus 456) and can be used, for example, to initiate testing or reading from a JTAG scan chain present on the DUT. The shared test bus is typically coupled to a different set of pins of the DUT than the set of pins on the DUT to which the drive/strobe-pins bus 456 is coupled.

The downloaded test bench 454 is arranged to access test vectors from the TDL image 444 and, upon entering a design for test mode (for example), sequentially apply time slices of the TDL image to the design pins during a test. For example, each slice (e.g., "row" or "line") of the test vectors can be sequentially read by incrementing program counter 446 in accordance with a clock received from clock generator 452. The value of the program counter 446 can be used to form an address that is asserted on address bus 448 for the purpose of addressing memory contents of the TDL image 444.

The PC 470 is arranged to communicate with the design under test (DUT) 460 via JTAG bus 464. JTAG bus 458 is coupled to a second input of JTAG multiplexer (MUX) 462. When the PC 470 is in a test master mode (e.g., with respect to the DUT 460), the JTAG multiplexer 462 is arranged to couple the JTAG bus 464 to the JTAG-bus design pins of the DUT 460 via shared test bus 466. For example, the "mastership" of the DUT 460 (and shared test bus 466) by CCS 111 executing on PC 470 allows the CCS 111 to view and control the test flow that is arranged to execute TDL from TDL image 444

In contrast with conventional solutions, full control of the execution flow of the code of the TDL image 444 is permitted, for example, using two test masters in an alternative fashion. In various embodiments the test masters can be (or be derived from) the same or different devices such that, for example, the PC 410 and the PC 470 can be the same or different physical (or virtual) devices. In the example embodiment, control of the execution flow of the code of the TDL image 444 is accomplished by establishing CCS 111 of PC 470 connectivity to the design on VDB for providing full control over the execution flow of the TDL image 444 that is loaded into the memory 440.

Full control of the execution flow of the code of the TDL image 444 can be accomplished by transferring test master control from the downloaded test bench 454 to the CCS 111 of PC 470. For example, the downloaded test bench 454 is arranged to act as a test master (e.g., by controlling JTAG pins of the DUT 460 via shared test bus 466) over loading and executing the code of the TDL image 444 in the DUT 460. After the execution has reached a certain point (e.g., such as a predetermined breakpoint set in advance by a CCS 111 of PC 410) in the TDL image 444, the downloaded test bench 454 is arranged to transfer control of the test to the CCS 111 of PC 470 such that the CCS 111 of PC 470 becomes the new test master. Arbiter (e.g., a mechanism embodied as logic gates in a silicon substrate) 470 is implemented to facilitate transference of the mastership of the test bus between the downloaded test bench 454 and the CCS 111 of PC 470. When the CCS 111 no longer has need of the mastership of the test bus, the downloaded test bench can resume testing (including restarting or executing a newly loaded test sequence) by acting as the current master of the test bus.

The arbiter 472 can select which of the downloaded test bench 454 and the CCS 111 of PC 470 is to be the master of shared bus 466. The arbiter 472 can select which is to be the master of shared bus 466 in response to a reset state, a command received from a controller (such as the VDB controller 430 or the VDB debugger 110) or evaluating contents of the JTAG bus 464, a DUT toggled output, and/or the contents of the JTAG bus 458.

Figure 5:
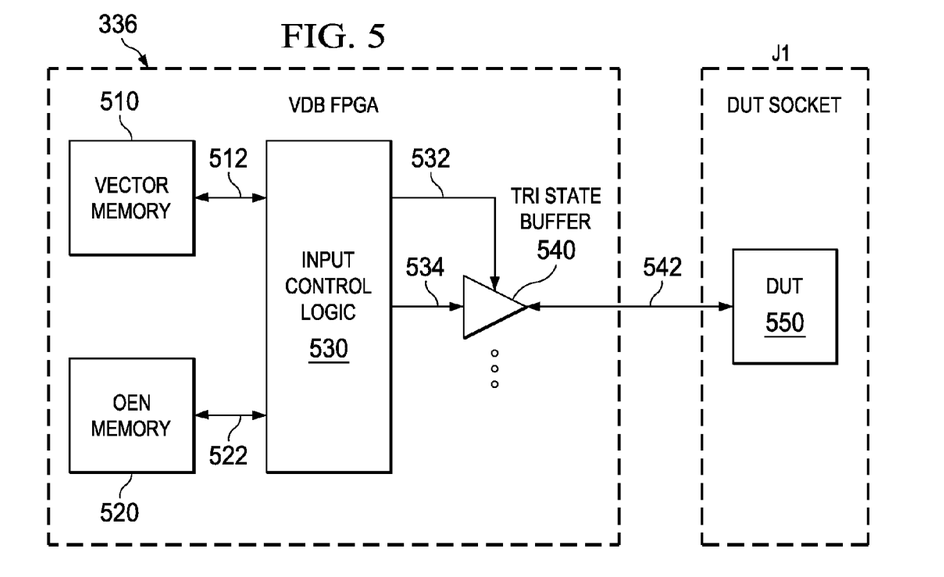
FIG. 5 is an architectural diagram that illustrates a validation design and debug board bus interface for a design under test in accordance with example embodiments of the disclosure.

FIG. 5 is an architectural diagram that illustrates a validation design and debug board bus interface for a design under test in accordance with example embodiments of the disclosure. Validation design and debug board FPGA 336 (and/or FPGA 450) includes a vector memory 510 and an output enable memory 520 that are used to drive input control logic (e.g., embodied at least partially in hardware) 530 via busses 512 and 522, respectively. Although the vector memory 510 and OEN memory 520 are illustrated as being resident on the VDB FPGA 336, all or some portions of the vector memory 510 and OEN memory 520 can be resident off of the VDB FPGA 336 (while, e.g., still being resident on the VDB board 300).

Vector memory 510 is arranged to store each of the values that are to be driven onto each of the DUT 550 design pins. The vector memory 510 also is arranged to store information for controlling execution of various TDL constructs such as SETR (e.g., set values of a pin at an expected rate), RUNP (e.g., run "packed" by repeating a previously set value), and END (e.g., halt execution). As mentioned above, program counter 446 can be used to generate addresses for accessing test vectors. In an embodiment, the program counter includes a state machine that is arranged to fetch and pack the test vectors from the associated memories and apply the test vectors onto the design pins at the expected rate (e.g., the SETR construct). When a RUNP construct is encountered by the state machine, the previously packed value is driven onto the design pins until a RUNP count expires. When an END construct is encountered, the previously packed value is driven until, for example, an event that occurs externally to the FPGA 336 or 450 that resets (or changes) the state machine.

The OEN memory 520 is arranged to store the direction information (e.g., output and/or input) of a state of a DUT design pin (or group of pins) for a test vector (or group of test vectors). The memory storage can be optimized, for example, by associating direction information using one word (e.g., 32 bits) of direction information per vector or by using one word per line (e.g., row) of TDL-based test vectors.

In operation, the downloaded test bench 454 is arranged, for example, to generate the direction information in response to the TDL image 444. When the test vectors in the vector memory 510 are being executed, addresses used to select a particular line of TDL are also used to retrieve the associated direction information for the selected line of TDL. The retrieved associated direction information for the selected line of TDL is used to control the states of one or more tri-state buffers 540 (not all buffers are shown for the purpose of clarity). For example, the direction information is applied via bus 532, which determines whether selected contents (e.g., bits or words) of bus 534 are output by selected, enabled tri-state buffers 540 onto bus 542 (which is coupled to the DUT 550 via connector J1.

The various embodiments described above are provided by way of illustration only and should not be construed to limit the claims attached hereto. Those skilled in the art will readily recognize various modifications and changes that could be made without following the example embodiments and applications illustrated and described herein, and without departing from the true spirit and scope of the following claims.

What is claimed is:

1. A test fixture, comprising:
   a test connector that is arranged to communicatively couple a design under test to the test fixture, said test connector including a shared test bus coupled to a first set of selected pins; and
   a programmable logic interface that is communicatively coupled to the test connector and is arranged to receive a downloadable test bench, wherein the downloadable test bench is arranged to apply test vectors from a first set of test vectors to a first test control bus;

a multiplexer that is arranged to selectively couple one of the first test control bus and a second test control bus to the shared test bus, wherein the second test control bus is arranged to apply test vectors from a second set of test vectors.

2. The test fixture of claim 1, wherein the second set of test vectors is supplied by a debugger that is operable by a human to control execution of the first set of test vectors.

3. The test fixture of claim 2, comprising an arbiter that is arranged to transfer mastership of the shared test bus between the debugger and downloadable test bench.

4. The test fixture of claim 2, wherein the first set of test vectors is arranged to validate a performance of the design under test coupled to the test connector.

5. The test fixture of claim 3, wherein:
the arbiter transfers mastership of the shared test bus dependent upon a command received from the programmable logic interface.

6. The test fixture of claim 3, wherein:
the arbiter transfers mastership of the shared test bus dependent upon contents of the first test control bus.

7. The test fixture of claim 3, wherein:
the arbiter transfers mastership of the shared test bus dependent upon contents of the second test control bus.

8. The test fixture of claim 3, wherein:
the arbiter transfers mastership of the shared test bus dependent upon an output of design under test.

9. The test fixture of claim 1, comprising an addressable memory in which the first set of test vectors is stored.

10. The test fixture of claim 9, wherein the programmable logic interface includes a field-programmable gate array (FPGA) that is programmed to include a program counter that is arranged to generate an address by which test vectors from the first set of test vectors are retrieved.

11. The test fixture of claim 10, wherein the value of the program counter is changed in response to a value of retrieved test vectors from the first set of test vectors.

12. The test fixture of claim 11, wherein a first portion of the first set of retrieved test vectors from the first set of test vectors is applied to the first set of selected pins of the test connector, and wherein a second portion of the first set of retrieved test vectors for the first set of test vectors is applied to a third test bus that is coupled to a second set of selected pins of the test connector, wherein the second set of selected pins of the test connector includes selected pins that are different from the selected pins in the first set of selected pins.

* * * * *